(12) United States Patent
Fung

(10) Patent No.: US 8,305,142 B2
(45) Date of Patent: Nov. 6, 2012

(54) THIRD ORDER INTERMODULATION CANCELLATION BY IN-LINE GENERATED SIGNAL

(75) Inventor: Gregory A. Fung, Fremont, CA (US)

(73) Assignee: Linear Technology Corporation, Milpitas, CA (US)

( * ) Notice: Subject to any disclaimer, the term of this patent is extended or adjusted under 35 U.S.C. 154(b) by 67 days.

(21) Appl. No.: 12/959,986

(22) Filed: Dec. 3, 2010

(65) Prior Publication Data

US 2012/0139629 A1 Jun. 7, 2012

(51) Int. Cl.
*H03F 1/26* (2006.01)
(52) U.S. Cl. ......................................................... 330/149
(58) Field of Classification Search .................. 330/149, 330/307, 296, 285, 277
See application file for complete search history.

(56) References Cited

U.S. PATENT DOCUMENTS 6,353,360 B1 * 3/2002 Hau et al. ...................... 330/149

* cited by examiner

*Primary Examiner* — Robert Pascal
*Assistant Examiner* — Khiem Nguyen
(74) *Attorney, Agent, or Firm* — Patent Law Group LLP; Brian D. Ogonowsky

(57) ABSTRACT

An actual linear amplifier distorts an input signal, such as an RF signal, and generates third order intermodulation (IM3) products. A single-port predistortion circuit is connected at a single node of an input line to the amplifier via an AC coupling capacitor. The fundamental frequency of the input signal is applied to a forward biased diode junction. The current through the diode is applied to a second capacitor. The appropriate setting of a tuning device, such as a tunable resistor or a tunable capacitor, causes the predistortion circuit to invert the second harmonic generated by the diode. The inverted second harmonic signal is applied to the single node of the input line to add predistortion to the signal applied to the amplifier. The predistortion cancels or substantially reduces the IM3 products at the output of the amplifier.

20 Claims, 4 Drawing Sheets

THIRD ORDER INTERMODULATION CANCELLATION BY IN-LINE GENERATED SIGNAL

FIELD OF THE INVENTION

This invention relates to a predistortion circuit for an amplifier and, in particular, to a technique for generating an inverted second harmonic signal for cancelling or mitigating third order intermodulation products generated by the amplifier.

BACKGROUND

An actual conventional "linear" amplifier, such as an RF amplifier, produces some distortion, such as generating second and third harmonics of the fundamental frequency, generating frequency-mixed signals, and generating intermodulation products. For example, a "linear" amplifier receiving sine waves $f_1$ and $f_2$ will output the following signals, having various magnitudes. The second and third order signals are output due to distortion:

| TERM | OUTPUT | FREQUENCY |
| --- | --- | --- |
| linear | fundamental | $f_1, f_2$ |
| $2^{nd}$ order | $2^{nd}$ harmonic | $2f_1, 2f_2$ |
| $3^{rd}$ order | $3^{rd}$ harmonic | $3f_1, 3f_2$ |
| $2^{nd}$ order | frequency mixing | $(f_2 - f_1), (f_2 + f_1)$ |
| $3^{rd}$ order | $3^{rd}$ order intermod. products | $(2f_2 - f_1), (2f_1 - f_2)$ |

The output current of the amplifier can be described by the following power series, limited to the third order:

$$i_{out} = g_{m1}V\text{in} + g_{m2}V\text{in}^2 + g_{m3}V\text{in}^3,$$

where the expansion coefficients $g_{m1}, g_{m2}, g_{m3}$ are equal to:

$$g_{m1}(V\text{in}) = dI_{out}/dV_{in}$$

$$g_{m2}(V\text{in}) = \tfrac{1}{2} d^2 I_{out}/dV_{in}^2 = \tfrac{1}{2} dg_{m1}/dV_{in}$$

$$g_{m3}(V\text{in}) = \tfrac{1}{6} d^3 I_{out}/dV_{in}^3 = \tfrac{1}{3} dg_{m2}/dV_{in}$$

Here, $g_{m1}V\text{in}$ is the linear amplification, $g_{m2}V\text{in}^2$ is the second order signals and mixing products, and $g_{m3}V\text{in}^3$ is the third order signals and third order intermodulation products.

The third order intermodulation (IM3) products are the most problematic since they may occur near a fundamental frequency and may be difficult to filter out. IM3 products can also be generated by the second order interaction (mixing) of the second harmonic and the fundamental frequency. If an inverted second harmonic is generated from the original signal by a predistortion circuit, and the inverted second harmonic is then combined with the original signal through second order mixing, such predistortion can cancel out the IM3 products. Predistortion circuits are common.

A typical predistortion circuit for cancelling IM3 products receives a signal split from the original signal (f), then frequency-doubles it (2f), then adjusts the level of 2f, then phase shifts the frequency doubled signal with a delay circuit to invert the signal, then bandpass filters the resulting signal, then combines the resulting signal with the original signal at the input to the amplifier. In another example, a calculated predistortion signal is combined at the output of the amplifier.

Such a predistortion circuit connected in parallel with the original signal path to the amplifier typically uses circuitry, such as a splitter, that cannot easily be put on an IC chip, much less put on the same IC chip as the amplifier circuitry. Such circuitry may include a transformer. Thus, such predistortion circuits add expense and take up circuit board real estate.

U.S. Pat. No. 6,414,545 describes a single-port predistortion circuit connected to an input node of the amplifier that uses a reversed biased diode junction of a transistor to generate the predistortion signal. The transistor size must be related to the size of the input transistor of the amplifier (e.g., 1/16 the size) to control the amount of predistortion. The reverse bias breakdown voltage of a transistor or diode varies significantly due to process variations. Therefore, the predistortion is difficult to control. Also, the reverse breakdown voltage is much higher than a diode's forward voltage. Therefore, generating a relatively high voltage is required to implement a reverse bias predistortion injector. Other drawbacks of that design also exist.

What is needed is an efficient predistortion circuit that does not have the drawbacks of the prior art predistortion circuits.

SUMMARY

To cancel or reduce IM3 products generated by an amplifier, a single-port predistortion circuit, in accordance with one embodiment of the invention, connects to a single node of the amplifier's input line via an AC coupling capacitor and generates an inverted second harmonic signal from the fundamental frequency of the input signal. The circuit uses the inherent non-linearity of a quasi-forward biased diode to generate the second harmonic. In one embodiment, the diode is the base-emitter junction of a bipolar transistor connected in a common emitter configuration.

The forward biased diode and a series capacitor combine to invert the second harmonic. No special phase inverter circuit is needed. The predistortion circuit is tunable by a resistor and/or a capacitor to generate the desired inverted frequency, such as through a range of 90 MHz to 600 MHz.

The inverted second harmonic signal is applied to the single node of the input line to add predistortion to the signal applied to the amplifier. The predistortion cancels or substantially reduces the IM3 products at the output of the amplifier.

The amplifier circuit may be single ended or differential.

By forming the predistortion circuit as a single-port device and using a forward biased diode as the harmonics generator, the circuit may be formed as an IC or added to the same IC forming the amplifier, and its connection to the amplifier circuit is simple. No splitters or combiners are needed.

In one embodiment, the amplifier and predistortion circuit are formed on the same IC chip, and the package includes one or more tuning terminals to allow the user to select the inverted frequency. In another embodiment, the tuning may be performed by a metal mask (e.g., controlling a capacitor or resistance value) or by another type of internal setting.

Various other embodiments are described.

BRIEF DESCRIPTION OF THE DRAWINGS

Elements that are the same or equivalent are labeled with the same numeral.

DETAILED DESCRIPTION

Figure 1:
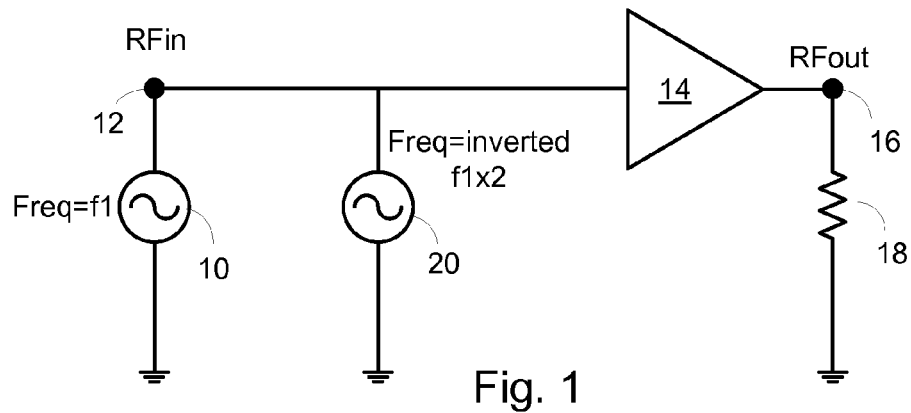
FIG. 1 illustrates the in-line generation of an inverted second harmonic signal in accordance with one embodiment of the invention.

FIG. 1 illustrates one embodiment of the invention. An external RF generator 10 applies a signal to an input terminal 12 of a linear amplifier 14. The terminal 12 may be an input terminal of a packaged IC. The amplifier 14 applies an amplified output signal to an output terminal 16 of the package. An external load 18 is represented as a resistor.

A predistortion circuit 20 is connected at a single node of the input line into the amplifier 14. The predistortion circuit 20 contains a forward biased diode, such as formed by the base-emitter junction of a bipolar transistor. The non-linearity of the forward biased diode inherently creates harmonics of the fundamental frequency (or frequencies) generated by the RF generator 10. For simplicity, it is assumed the RF generator 10 generates only a single fundamental frequency.

It is also assumed that the amplifier 14 is a non-idealized circuit (e.g., a typical, slightly non-linear amplifier) that internally generates harmonics which interact with themselves and the fundamental frequency to produce the frequency mixing and third order intermodulation (IM3) products described above.

The frequency of the predistortion circuit 20 at which inversion occurs (i.e., the second harmonic) may be tunable by adjusting a component value. Tuning may be performed using a metal mask or by applying a signal or component to one or more package pins. This inverted second harmonic is then applied to the input of the amplifier 14 for cancellation or attenuation of the IM3 products. In an actual circuit, the desired tuning will invert a frequency approximately equal to the second harmonic.

Figure 2:
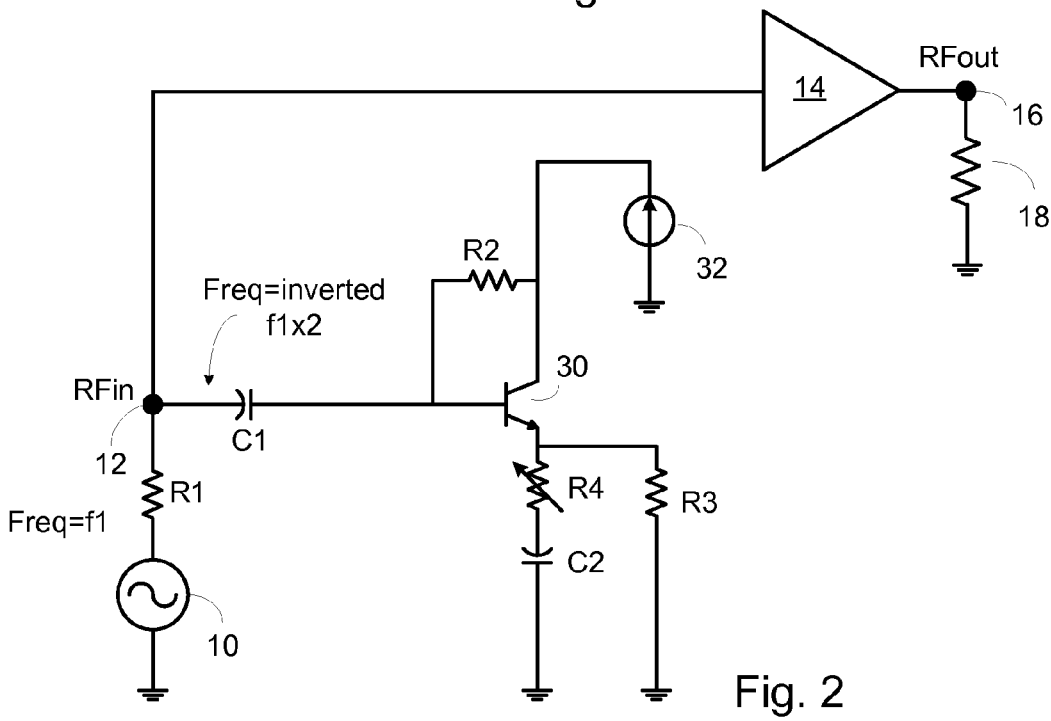
FIG. 2 illustrates one implementation of the in-line predistortion circuit for generating an inverted second harmonic signal in accordance with one embodiment of the invention.

FIG. 2 illustrates one embodiment of a predistortion circuit in accordance with the invention.

Resistor R1 represents an output impedance (e.g., 50 ohms) of the RF generator 10.

A terminal of a DC blocking capacitor C1 (also referred to as an AC coupling capacitor) is coupled to a node 12 on the input line into the linear amplifier 14.

A bipolar transistor 30 is connected in a common emitter configuration, with its base connected to a terminal of the blocking capacitor C1. Its collector is connected to a constant current source 32, which may be any suitable conventional current source for the fabrication process used. A resistor R2 is connected between the base and collector of the transistor 30 to provide a DC bias to the base to operate the transistor 30 within the desired non-linear range of operation. The current source 32 may be adjustable to operate the base-emitter diode in its optimal range for generating second harmonics at the desired amplitude, such as in the knee area of the diode curve between what is referred to as its on state and off state. This state may be referred to as a quasi-forward biased state. Other operating regions of the diode may also be used to generate the second harmonic. The resistor R3, connected between the emitter and ground, conducts the DC bias current.

As the transistor 30 current is modulated by the input signal from the RF generator 10, the AC emitter current is conducted by the series connection of the tunable resistor R4 and the capacitor C2. The distortion by the forward biased diode generates second harmonics of the RF fundamental frequency. The resistor R4 is tuned so that a 180 degree inversion occurs at the second harmonic due to the phase shift by the diode and capacitor C2. In one embodiment, the tuning is adjustable for a fundamental frequency range of 90 MHz to 600 MHz. The optimal tuning may be predetermined by knowing the RF fundamental frequency or may be determined by viewing the amplifier 14 output signal and selecting a tuning that minimizes the distortion.

In one embodiment, the circuit of FIG. 2 has the following component values for an RF generator 10 operating between 90 MHz and 600 MHZ:

C1=100 pF
R2=50K ohms
R4=tunable from 0-10K ohms
C2=10 pF
R3=50K ohms
Current source 32=2 mA To provide further or alternative tuning, an optional adjustable capacitor may be connected between the base and emitter of the transistor 30. The small sizes of the capacitors allow them to be formed as part of an IC.

Figure 3:
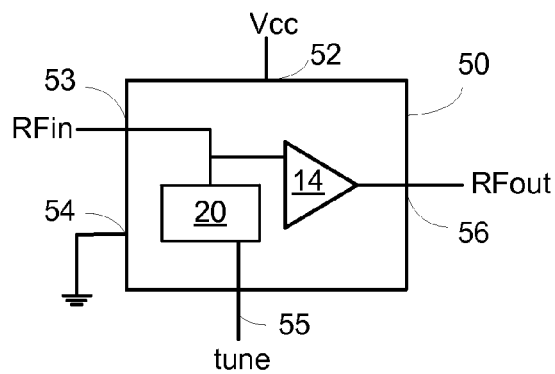
FIG. 3 illustrates terminals of a package containing the amplifier and predistortion circuit on a single chip.

FIG. 3 illustrates any type package 50 housing at least the amplifier 14 and the predistortion circuit 20. The circuitry may be formed as a single IC, or multiple ICs may be in the same package. The package 50 has terminals 52-56 that are intended to be soldered to a printed circuit board. In one embodiment, for a single ended amplifier circuit that amplifies an RF signal, the inputs are Vcc, RFin, ground, tune, and RFout. The signals to be amplified may be other than RF. The tune terminal 55 may be for connection to a selected resistor, or may be multiple terminals for applying a digital signal that sets an internal value, or may use any other type of tuning means for setting the inverted second harmonic frequency. Alternatively, the tuning may be performed while processing the IC, such as using a metal mask or laser to set a resistance or capacitance value.

If the amount of distortion generated by the particular amplifier 14 is known, the amplitude of the second harmonic may be optimized by adjustment of the DC bias of the diode and/or the tunable resistor R4.

Figure 4:
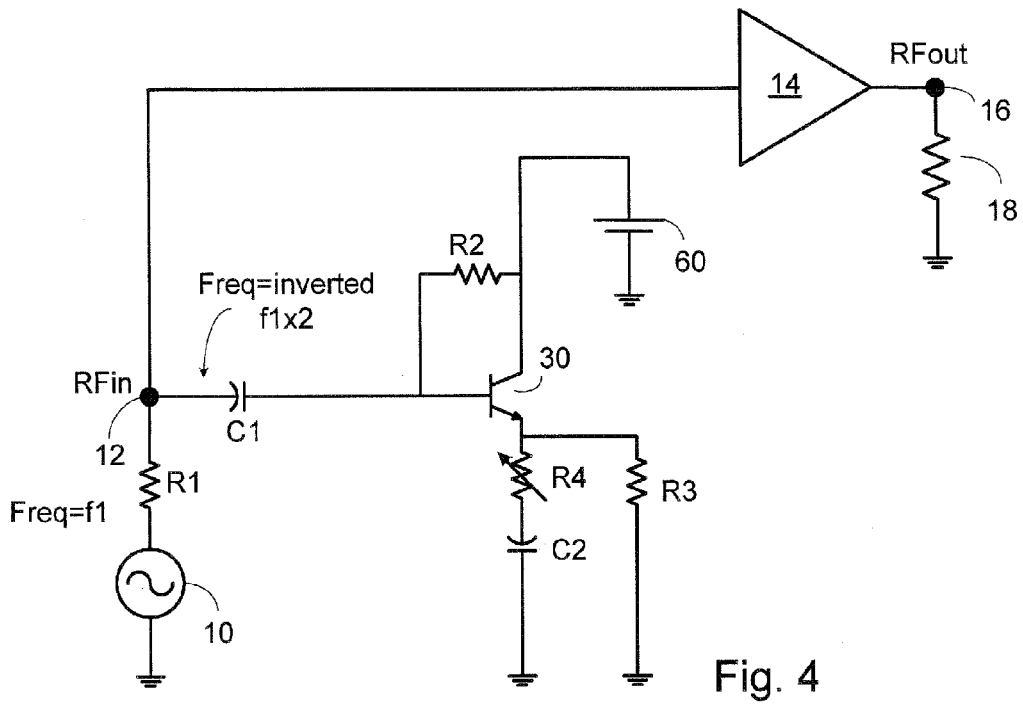
FIG. 4 illustrates an embodiment of the predistortion circuit using a voltage source to bias the transistor rather than a current source.

FIG. 4 illustrates that the current source 32 may be replaced by a fixed voltage source 60, such as a 5 volt source.

Figure 5:
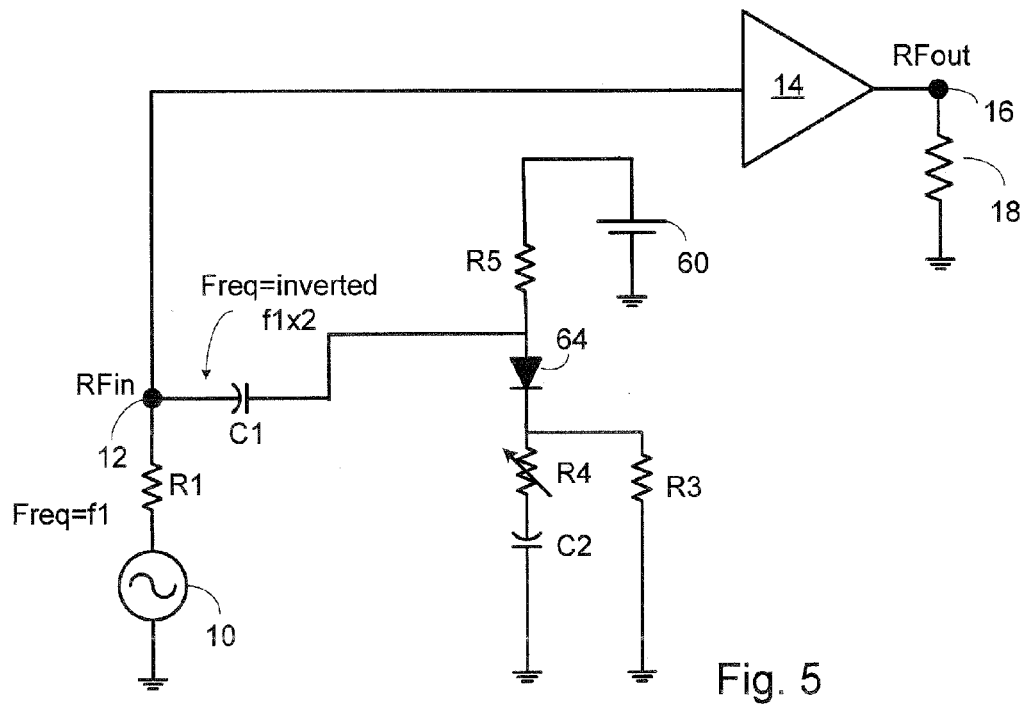
FIG. 5 illustrates an embodiment of the predistortion circuit using a diode instead of a transistor.

FIG. 5 illustrates that the transistor 30 of FIG. 4 may be replaced by a diode 64. The resistor R5 in one embodiment is 200 ohms. In one embodiment, the bias current through the diode is 5.56 uA, dropping 278 mV across resistor R3. The diode 64 may be operated in its knee region or around other forward-biased operating points.

Figure 6:
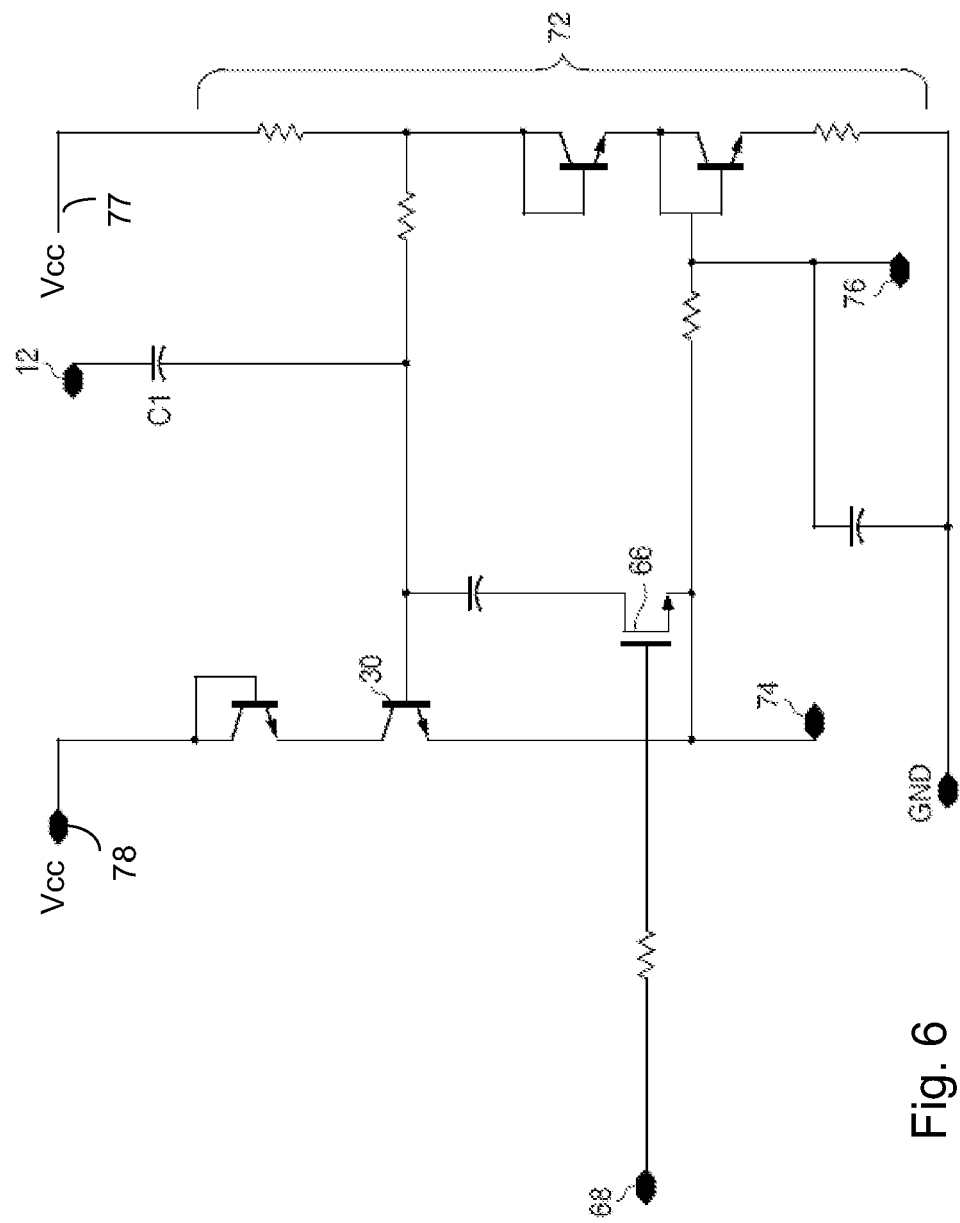
FIG. 6 is a schematic of one embodiment of the frequency doubler/inverter, which uses a tunable resistor and tunable capacitor to select the frequency to be inverted.

FIG. 6 is a schematic of one embodiment of the frequency doubler/inverter, which uses a tunable resistor and tunable capacitor to select the frequency to be inverted. The MOSFET 66, connected across the base and emitter of the transistor 30, has a parasitic capacitance that is tuned by a voltage applied to terminal 68. The voltage may be applied via a package pin (similar to terminal 55 in FIG. 3) or a metal mask. A circuit 72 provides a DC bias to the base of the transistor 30 for operating it in the desired region. A tunable resistor (FIG. 7) is applied to the terminal 74. A current source (not shown) to ground is connected to the terminal 76 to draw emitter current rather than using the current source 32 in FIG. 2 connected to the collector. Terminals 77 and 78 are connect to a voltage source Vcc. The inverted $2^{nd}$ harmonic appears at terminal 12.

Figure 7:
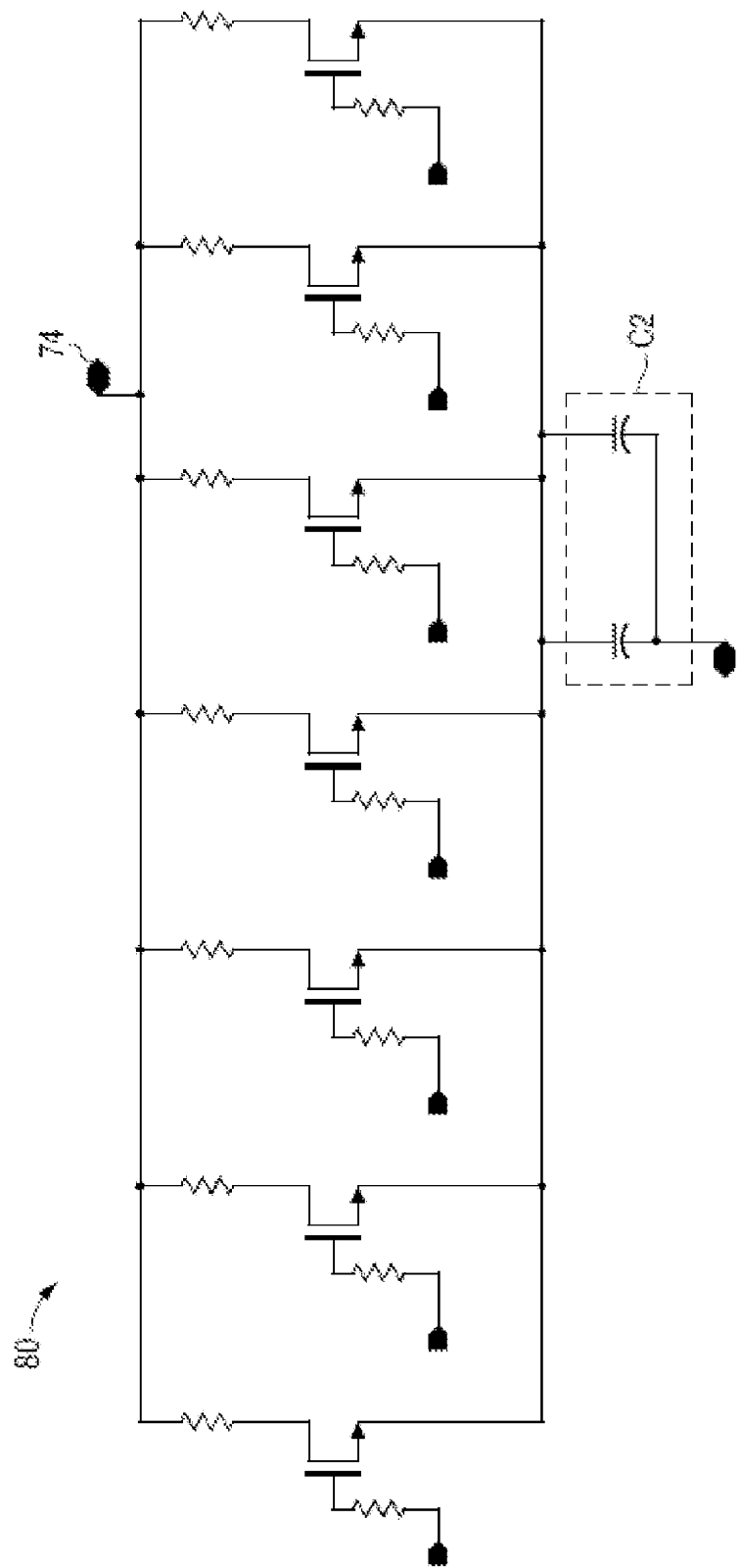
FIG. 7 is a schematic of a tunable resistor whose value may be selected by digital signals applied to package pins or selected by a metal mask.

FIG. 7 is a schematic of a 7-bit tunable resistor 80 whose value may be selected by digital signals applied to package pins or selected by a metal mask. Each logical 1 bit connects a different resistor value in parallel via MOSFET switches. The tunable resistor 80 is connected between the terminal 74 and ground in FIG. 6. The capacitor C2 is shown as two capacitors in parallel.

The component values in FIGS. 6 and 7 depend on the particular application of the circuit.

As seen, the predistortion circuit is a single-port device that uses a forward biased diode as the harmonics generator. Since the forward biased characteristics of the diode are used, as opposed to the reversed biased characteristics, the predistortion characteristics are relatively insensitive to process variations. By making the predistortion circuit a single-port circuit without the use of splitters or couplers, the circuit may be formed as an IC or added to the same IC forming the amplifier, and its connection to the amplifier circuit is simple.

If the amplifier 14 (FIG. 2) were a differential amplifier, an inverted RF input and output terminal would be needed. Identical predistortion circuits can be connected to the non-inverted RF input signal and inverted RF input signal. Alternatively, a single predistortion circuit connected to the non-inverted RF input can generate the signal describe with respect to FIG. 2, and that signal could be inverted and applied to the inverted RF input signal.

Additional circuitry may be connected between the various components shown in FIG. 2, such as resistors or other components.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit comprising:
    a first node for passing a first input signal for amplification by an amplifier, the first input signal having a fundamental frequency, the amplifier being assumed to add unwanted distortion to an amplified first input signal stemming from generation of a multi-ordered harmonic of the fundamental frequency; and
    a predistortion circuit connected to the first node without being connected to the output of the amplifier, the predistortion circuit comprising:
        a single input/output node coupled to the first node, wherein the single input/output node both receives the first input signal at the first node and provides at the first node a predistortion output signal of the predistortion circuit, derived from the first input signal, that is applied to an input of the amplifier;
        a first capacitor having a first terminal connected to receive the fundamental frequency, the first capacitor having a second terminal;
        a forward biased diode junction connected to receive the fundamental frequency from the second terminal, the diode junction conducting a forward biased current and generating at least a second harmonic of the fundamental frequency; and
        a second capacitor connected to the diode, the second capacitor receiving at least some of the forward biased current such that a combination of at least the diode and the second capacitor generates an inverted signal having a frequency approximately equal to the second harmonic of the fundamental frequency, wherein the inverted signal is coupled through the first capacitor to the first node for providing the predistortion output signal to the first input signal.

2. The circuit of claim 1 wherein the diode is a base-emitter junction of a bipolar transistor.

3. The circuit of claim 2 wherein the second capacitor is coupled to an emitter of the transistor.

4. The circuit of claim 1 further comprising a tunable resistance connected in series with the diode and the second capacitor, the tunable resistor being tunable to select a signal to invert having the frequency approximately equal to the second harmonic of the fundamental frequency.

5. The circuit of claim 4 wherein the circuit is housed in a package having terminals, wherein at least one terminal is connected to select a resistance value.

6. The circuit of claim 4 wherein the circuit is housed in a package, and wherein the tunable resistance is within the package.

7. The circuit of claim 1 further comprising a DC bias circuit operating the diode within a certain forward-biased operating range.

8. The circuit of claim 1 further comprising a tunable capacitor connected across the diode, the tunable capacitor being tunable to select a signal to invert having the frequency approximately equal to the second harmonic of the fundamental frequency.

9. The circuit of claim 8 wherein the tunable capacitor comprises a MOSFET.

10. The circuit of claim 9 wherein the circuit is housed in a package having terminals, wherein at least one terminal is connected to select a tunable capacitance.

11. The circuit of claim 1 wherein the amplifier and predistortion circuit are formed as a single integrated circuit within a package.

12. The circuit of claim 1 wherein the predistortion circuit is tunable to invert a signal, having the frequency approximately equal to the second harmonic of the fundamental frequency, within a certain range of frequencies.

13. The circuit of claim 12 wherein the range of frequencies is RF.

14. A method of reducing distortion output from an amplifier, the amplifier receiving a first input signal for amplification, the first input signal having a fundamental frequency, the amplifier adding unwanted distortion to an amplified first input signal stemming from generation of a multi-ordered harmonic of the fundamental frequency, the method comprising:
    receiving the fundamental frequency at a first terminal of a first capacitor, the first capacitor having a second terminal, wherein the first terminal is an input/output node of a predistortion circuit that, at the first terminal, both receives the first input signal and provides a predistortion output signal of the predistortion circuit, derived from the first input signal, that is applied to an input of the amplifier without being applied to the output of the amplifier;
    generating at least a second harmonic of the fundamental frequency by a forward biased diode coupled to the second terminal of the first capacitor;
    applying a current through the diode to a second capacitor, wherein a combination of at least the diode and the second capacitor generates an inverted signal having a frequency approximately equal to the second harmonic; and
    coupling the inverted signal through the first capacitor to the first terminal, as the predistortion output signal of the predistortion circuit, for providing predistortion to the first input signal applied to the amplifier.

15. The method of claim 14 wherein the diode is a base-emitter junction of a bipolar transistor.

16. The method of claim 15 wherein the second capacitor is coupled to an emitter of the transistor.

17. The method of claim 14 further comprising selecting a resistance connected in series with the diode and the second capacitor to select a signal to invert having the frequency approximately equal to the second harmonic of the fundamental frequency.

18. The method of claim 17 wherein selecting the resistance comprises tuning a tunable resistance.

19. The method of claim 14 further comprising tuning a tunable capacitor connected across the diode to select a signal to invert having the frequency approximately equal to the second harmonic of the fundamental frequency.

20. The method of claim 14 wherein the inverted signal is tunable using at least one of mask programming, one or more external signals applied to integrated circuit package terminals, or a component connected to one or more integrated circuit package terminals.

* * * * *